United States Patent [19]

Kikuchi

[11] 4,031,410
[45] June 21, 1977

[54] THREE-STATE DISCERNMENT CIRCUIT

[75] Inventor: Tadao Kikuchi, Tokyo, Japan

[73] Assignee: Hitachi, Ltd., Japan

[22] Filed: June 22, 1976

[21] Appl. No.: 698,788

[30] Foreign Application Priority Data

June 23, 1975  Japan .............................. 50-75566

[52] U.S. Cl. ............................... 307/209; 307/215;
307/216; 307/247 A; 307/244; 307/236;
328/92; 328/95

[51] Int. Cl.$^2$ .................. H03K 19/08; H03K 17/02

[58] Field of Search .......... 307/215, 216, 209, 232,
307/242, 244, 247 A, 236; 328/105, 153, 91,
92, 95, 96

[56] References Cited

UNITED STATES PATENTS

| 3,832,576 | 8/1974 | Proebsting | 307/244 |
| 3,969,633 | 7/1976 | Paluck et al. | 307/244 |

OTHER PUBLICATIONS

"Ternary CMOS Logic Device" by Grimes in IBM Tech. Disclos. Bull., vol. 17, No. 4, Sept. 1974, pp. 1145–1146.

"Three–State Indicating Ckt" by Powell in IBM Tech. Disclos. Bull., vol. 19, No. 5, Oct. 1976, pp. 1898–1899.

Primary Examiner—Stanley D. Miller, Jr.
Attorney, Agent, or Firm—Craig & Antonelli

[57] ABSTRACT

In a three-state discernment circuit, a signal including alternately recurring logic 0 and 1 levels is applied to a predetermined terminal to be suitably processed for discerning three different states. The signal including the logic 0 and 1 levels is applied to the predetermined terminal through a high output impedance circuit, and predetermined gate circuits are discerned in accordance with a power source potential condition, an opened condition and a round potential condition of the predetermined terminal.

2 Claims, 6 Drawing Figures

THREE-STATE DISCERNMENT CIRCUIT

BACKGROUND OF THE INVENTION

1. Field of the Invention

The present invention relates to a three-state discernment circuit, and more particularly to a circuit in which three states are discriminated by controlling one terminal.

2. Description of the Prior Art

In digital systems such as those used in electronic digital watches and the like, it is sometimes required to control three different states by an external terminal or terminals. For example, it is desired to control the brightness of display in a display device of an electronic digital watch in accordance with the conditions of light in the atmosphere in such a manner that a time for which the display device is excited is adjusted by a manual switch. Namely, since the luminous intensity in a discharge display device such as Digitron and Nixie or a light emitting display device such as LED (light emitting diode) is constant, the lower brightness in the display device gives some difficulty in observing a displayed pattern when the illumination in the atmosphere is high, i.e. when the atmosphere is light. Then, the brightness in the display device must be increased. In the night or when the atmosphere is dark, on the other hand, the display is sufficient in the low brightness and the higher brightness makes a displayed pattern obscure or makes the observation of the pattern difficult.

Therefore, it is desired to control three different states by means of an external terminal in such a manner that the brightness in a display device is established to a high level, a middle level and a low level.

A prior art digital system of such a kind includes a circuit in which a pair of controllable external terminals are provided for producing three states by the combination of 0 and 1. Another prior art digital system includes a circuit in which a single controllable external terminal is provided for producing such states by the combination of analog quantities of different levels, for example, a ground level, an open-circuit a level of $-\frac{1}{2} V_B$ and a level of $-V_B$ ($V_B$: power source voltage). However, the former prior art digital system has been defective in that four different combinations of 0 and 1 are produced by the provision of the two externally controlled terminals in the circuit resulting in the presence of the redundancy. The latter prior art digital system has also been defective in that a structure including such analog circuit portion in the digital system is difficult to be integrated into an LSI form, especially in the design of MOSFET's (for example, the control of the threshold voltage of MOSFET). Further, this latter prior art digital system has been defective in that the circuit operation tends to operate erroneously due to noises since the circuit is not adapted for synchronous operation.

SUMMARY OF THE INVENTION

It is a primary object of the present invention to provide a three-state discernment circuit which overcomes the prior art defects pointed out above.

According to the present invention, a signal including logic 0 and 1 levels alternately generated in synchronism with a clock signal is applied to one predetermined terminal through an output circuit having a high output impedance, and predetermined gate circuits are discerned in accordance with a power source potential condition, an opened condition and a ground potential condition of the predetermined terminal.

In a preferred embodiment of the three-state discernment circuit according to the present invention, there is means for receiving a signal (referred to hereinafter as signal A) from the predetermined terminal to generate a signal (referred to hereinafter as signal B) synchronous with the clock signal but delayed by one bit relative to the signal A. The circuit further comprises EXCLUSIVE OR circuit means for producing an EXCLUSIVE OR combination of the signals A and B, first NOR circuit means for producing a NOR combination of the signal A or B and the EXCLUSIVE OR signal, and second NOR circuit means for producing a NOR combination of an inverted one of the signal A or B and the EXCLUSIVE OR signal. In the three-state discernment circuit having such a construction, when the predetermined terminal is connected to a power source potential, the signals A and B are fixed at a logic 0 level so that the outputs of the EXCLUSIVE OR circuit means the first NOR circuit means and the second NOR circuit means have logic 0, 0 and 1 levels respectively. As a result, the second NOR circuit means is discerned. When the predetermined terminal is opened, the signals A and B take logic 0 and 1 levels alternately so that the outputs of the EXCLUSIVE OR circuit means, the first NOR circuit means and the second NOR circuit means have logic 1, 0 and 0 levels respectively. As a result, the EXCLUSIVE OR circuit means is discerned. When the predetermined terminal is connected to a ground potential, the signals A and B are fixed at a logic 0 level so that the outputs of the EXCLUSIVE OR circuit means, the first NOR circuit means and the second NOR circuit means have logic 0, 1 and 0 levels respectively. As a result, the first NOR circuit means is discerned. In this manner, three gate circuits can be discerned by controlling the predetermined terminal.

DESCRIPTION OF THE PREFERRED EMBODIMENTS

Figure 1:
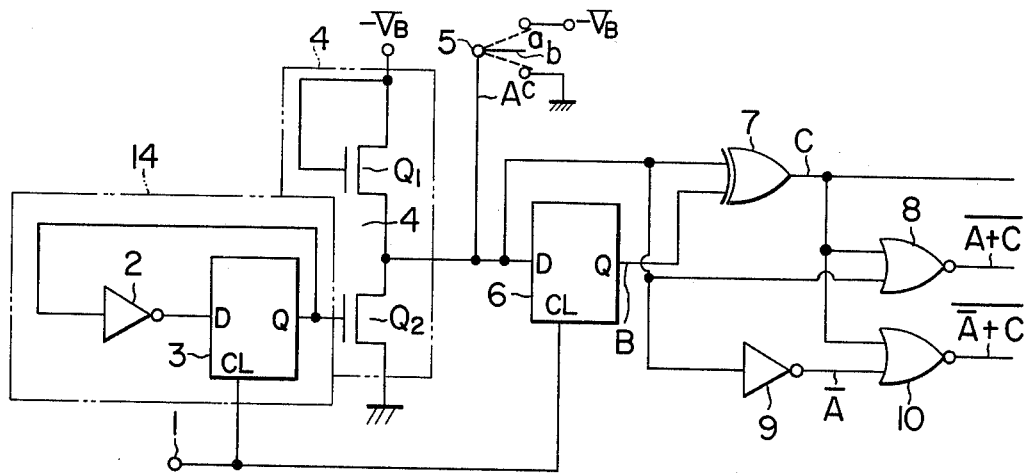
FIG. 1 is a circuit diagram of an embodiment of the three state discernment circuit according to the present invention.

Referring to FIG. 1 showing a construction of a preferred embodiment of the three-state discernment circuit according to the present invention, a clock signal is applied to a clock input terminal 1, and a circuit 14 generates a signal including 0 and 1 levels which are alternately generated in synchronism with the clock signal applied to the clock input terminal 1. This circuit 14 includes an inverter 2 and a delayed type flip-flop 3. The output of the circuit 14 is coupled to an output circuit 4 which has a high output impedance and includes a pair of MOSFET's $Q_1$ and $Q_2$. An external terminal 5 is connected to the output of the output circuit 4.

A signal A from the circuit 14 is applied from the external terminal 5 to a second delayed type flip-flop 6. The flip-flop 6 generates a signal B which is synchronous with the clock signal but delayed by one bit relative to the signal A. An EXCLUSIVE OR circuit 7 produces an output or EXCLUSIVE OR signal C representative of a EXCLUSIVE OR combination of the signals A and B. A first NOR circuit 8 produces an output signal $\overline{A+C}$ representative of a NOR combination of the signal A and the EXCLUSIVE OR signal C. An inverter 9 inverts the signal A to produce an inverted signal $\overline{A}$. A second NOR circuit 10 produces an output signal $\overline{\overline{A}+C}$ representative of a NOR combination of the signal $\overline{A}$ and the EXCLUSIVE OR signal C.

The operation of the circuit of the present invention will be explained hereinbelow with respect to negative logic.

The present invention utilizes a property of an MOS inverter circuit that the MOS inverter circuit designed to have an output terminal of high output impedance, the output appearing at the output terminal of the circuit can be substantially maintained at a logic 1 or 0 level when it is connected to a power source or ground. In a P channel enhancement or depletion MOS inverter circuit including drive and load MOSFET's, the ratio of a resistance of the drive MOSFET in its turn-on state to that of the load MOSFET in its turn-on state is generally selected in a range from 1/10 to 1/20. Assume that the resistances of the drive and load MOSFET's in their turn-on states are 10 KΩ and 150 KΩ respectively. These values of resistance are usual in high output impedance design. In the case where a junction point between the drive and load MOSFET's is coupled to a potential of $-10V$ ($-V_B$), a current flowing through the drive MOSFET is about 1 mA even when the drive MOSFET is turned on or when a gate of the drive MOSFET is at a level of $-V_B$. As a result, the power consumption is small so that the circuit is not subjected to thermal influence. On the other hand, the case where the junction point is coupled to a ground level is equivalent to the case where the drive MOSFET is turned on in a normal inverter operation. As a result, the circuit is not adversely affected.

Now when the external terminal 5 is connected to a power source potential as indicated with $a$ in FIG. 1, the external terminal 5 is fixed at the power source potential level (logic 1 level) by means of the output circuit 4 having a high output impedance, and an output of logic 1 level appears from the flip-flop 6. Therefore, an output of logic 0 level appears from the EXCLUSIVE OR circuit 7, an output of logic 0 level appears from the NOR circuit 8, and an output of logic 1 level appears from the NOR circuit 10 due to the fact that an output of logic 0 level appears from the inverter 9. As a result, the output of the NOR circuit 10 is discerned.

When the external terminal 5 is disconnected or opened as indicated with $b$ in FIG. 1, the signal A including alternately recurring logic 0 and 1 levels is applied directly to the flip-flop 6. In this case, an output of logic 1 level appears from the EXCLUSIVE OR circuit 7 and an output of logic 0 level appears from each of the NOR circuits 8 and 10. As a result, the output of the EXCLUSIVE OR circuit 7 is discerned.

When the external terminal 5 is connected to a ground potential as indicated with $c$ in FIG. 1, the external terminal 5 is fixed at the ground potential level (logic 0 level) by means of the output circuit 4 having a high output impedance, and an output of logic 0 level appears from the flip-flop 6. Therefore, an ouput of logic 0 level appears from the EXCLUSIVE OR circuit 7, an output of logic 1 level appears from the NOR circuit 8, and an output of logic 0 level appears from the NOR circuit 10 since an output of logic 1 level appears from the inverter 9. As a result, the output of the NOR gate 8 is discerned.

Thus, the outputs of the circuits 10, 7 and 8 can be discerned when the external terminal 5 is connected to the power source potential, opened, and connected to the ground potential, respectively.

Figure 2:
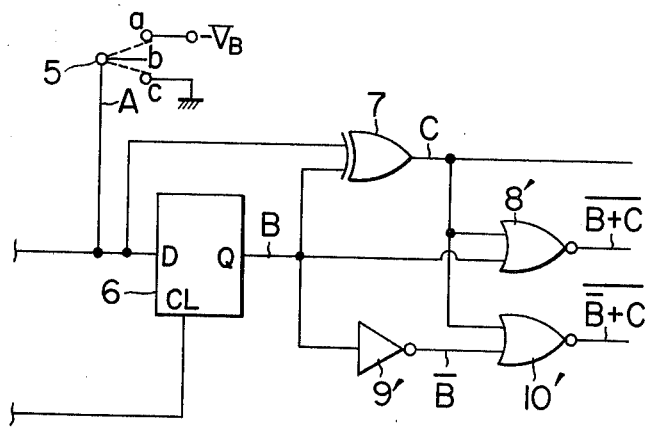
FIG. 2 is a circuit diagram of principal parts of another embodiment of the three-state discernment circuit according to the present invention.

FIG. 2 shows a partial modification of the three-state-discernment circuit according to the present invention shown in FIG. 1. Referring to FIG. 2, the NOR circuit 8 is replaced by a NOR circuit 8' which produces an output signal $\overline{B+C}$ in response to the application of the respective signals B and C from the flip-flop 6 and EXCLUSIVE OR circuit 7. The inverter 9 is replaced by an inverter 9' which inverts the signal B to provide an inverted signal $\overline{B}$. The NOR circuit 10 is replaced by a NOR circuit 10' which produces an output signal $\overline{\overline{B}+C}$ in response to the application of the respective signals $\overline{B}$ and C from the inverter 9' and EXCLUSIVE OR circuit 7. It is apparent that, in this modification too, the outputs of the circuits 10', 7 and 8' can be discerned when the external terminal 5 is connected to the power source potential, opened, and connected to the ground potential, respectively.

Next, an example in which the discernment circuit according to the present invention is used in a brightness control circuit for a display device will be explained in conjunction with FIGS. 3 to 6.

Figure 3:
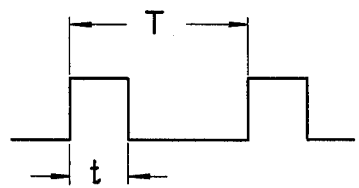
FIGS. 3 and 4 are views for explaining the fundamental concept of brightness control.
Figure 4:
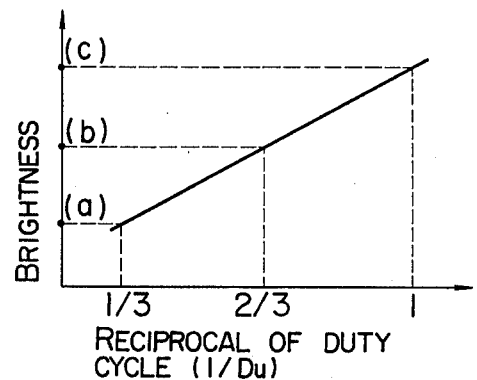

FIGS. 3 and 4 are views for explaining the fundamental concept of brightness control of a display device in the case where it is effected by controlling a duty cycle. In FIG. 3, a duty $Du$ is represented by $T/t$. Here, T and $t$ are the period and pulse width of a pulse signal respectively. The relationship between the reciprocal of duty cycle and the brightness is shown in FIG. 4. From the figure it is apparent that the discernment circuit of the present invention is required in order to provide three levels of brightness, i.e. a high level, a middle level and a low level.

Figure 6:
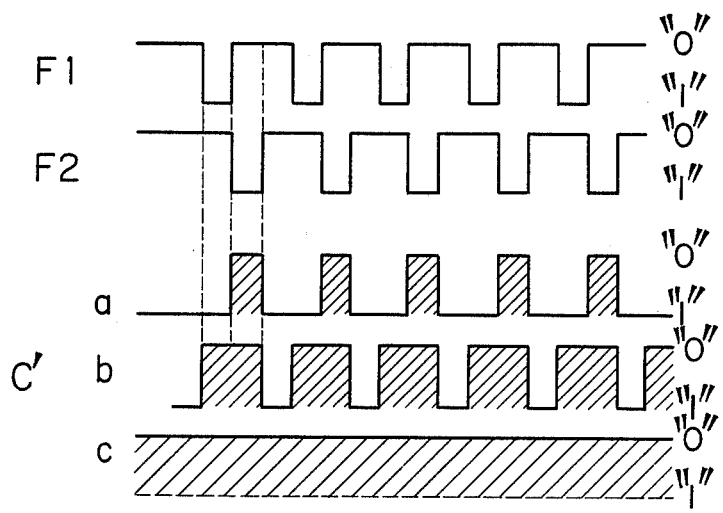
FIG. 6 is a time chart for explaining the operation of the brightness control circuit shown in FIG. 5.
Figure 5:
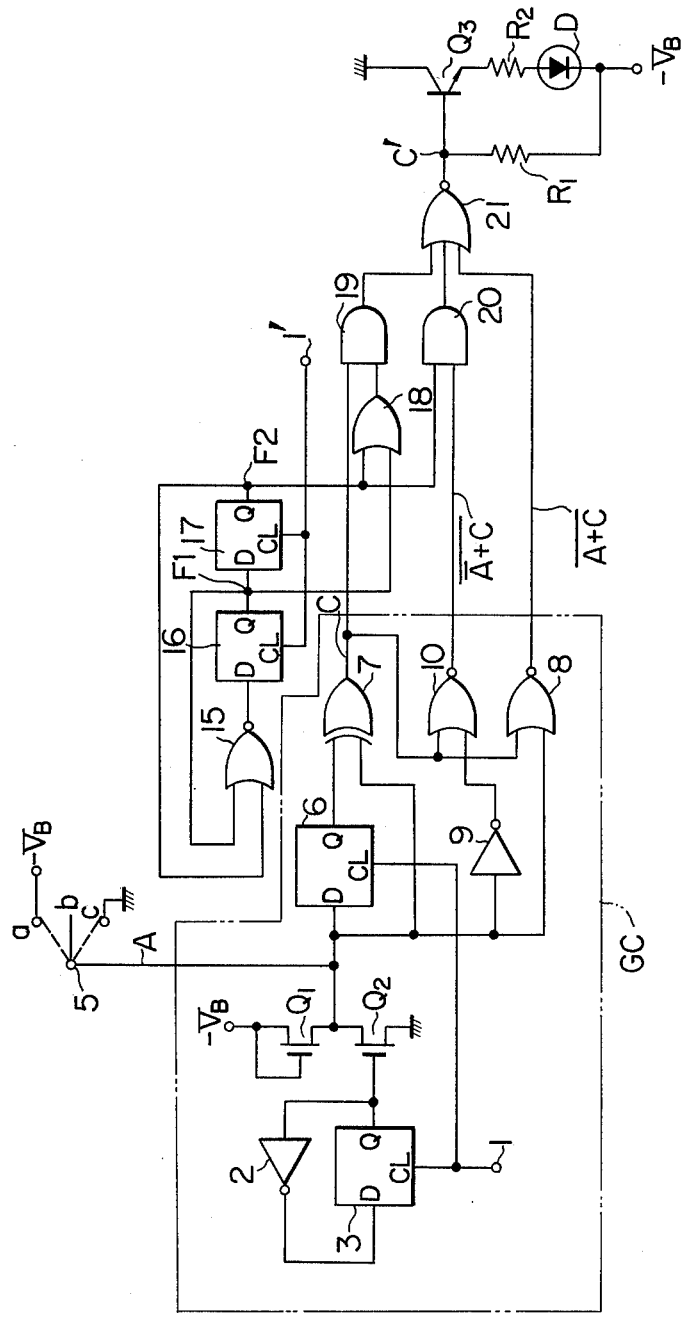
FIG. 5 is a circuit diagram of a brightness control circuit in which the discernment circuit shown in FIG. 1 is used.

FIG. 5 shows a brightness control circuit using the discernment circuit of the present invention. In FIG. 5, symbol GC represents the three-state discernment circuit shown in FIG. 4. Reference numerals 15 and 21 represent NOR circuits, numerals 16 and 17 represent delayed flip-flop circuits, numeral 18 represents an OR circuit, and numerals 19 and 20 represent AND circuits. Symbols $R_1$ and $R_2$ represent resistors, symbol $Q_3$ represents an amplifier transistor and symbol D represents a light emitting diode. A clock signal is applied to a terminal 1'. This clock signal may be the same as the clock signal applied to the terminal 1. The delayed flip-flop circuits 16 and 17 produce, at their outputs $F_1$ and $F_2$, signals as shown in FIG. 6.

In operation of the circuit shown in FIG. 5, when the external terminal 5 is connected to a power source potential, the outputs of logic 0, 1 and 0 levels appear from the EXCLUSIVE OR circuit 7, the NOR circuit 10 and the NOR circuit 8 respectively, as described above. As a result, a signal as shown in (a) of FIG. 6 appears at the output C' of the NOR circuit 21. The light emitting diode D emits light when the output C' of the NOR circuit 21 is in a 0 level (i.e. a ground level). In FIG. 6, shaded areas indicate the time periods when the diode D is emitting light. The waveform (a) of FIG. 6 has a duty of 3 so that the brightness of the diode D provides a level (a) of FIG. 4. This brightness is suitable in the dark or night.

When the external terminal 5 is opened, the outputs of logic 1, 0 and 0 levels appear from the EXCLUSIVE OR circuit 7, the NOR circuit 10 and the NOR circuit 8 respectively. As a result, a signal as shown in (b) of FIG. 6 appears at the output C' of the NOR circuit 21. The diode D emits light during the time periods corresponding to the shaded areas shown in (b) of FIG. 6. The waveform (b) of FIG. 6 has a duty of 3/2 so that the brightness of the diode D provides a level (b) of FIG. 4. This brightness is suitable in the gloom or semi-dark.

When the external terminal 5 is connected to a ground potential, the outputs of logic 0, 0 and 1 levels appear from the EXCLUSIVE OR circuit 7, the NOR circuit 10 and the NOR circuit 8 respectively. As a result, a signal as shown in (c) of FIG. 6 appear at the output C' of the NOR circuit 21. In this case, the diode emits light continuously. The waveform (c) of FIG. 6 has a duty of 1 so that the brightness provides a level (c) of FIG. 4. This brightness is suitable in the light.

As described in the foregoing, the three-state discernment circuit according to the present invention can provide easily the control of three different states by one terminal drawn out of an LSI chip and is applicable to a brightness control circuit for a display device.

In the embodiments of the present invention described hereinbefore, a clock signal of one phase is applied to the flip-flops 3 and 6. However, two clock signals, namely, a clock signal of first phase and another clock signal of second phase may be applied to the flip-flops 3 and 6. For example, a first clock signal may be used to control the inversion of the input to the flip-flop 3, and a second clock signal may be used to control the delivery of the output from the flip-flop 3.

It is apparent that the present invention is remarkably effectively applicable to various kinds of digital circuits of MOS structure.

It will be understood from the foregoing description that the three-state discernment circuit according to the present invention can easily discern three gate circuits when one external terminal is merely connected to a power source potential, opened or disconnected, and connected to a ground potential, respectively. The present invention is therefore advantageous in that any especial external signals need not be applied for the purpose of obtaining such binary signals. Further, the digital circuit of the present invention can be easily designed. Furthermore, the synchronous operation improves the anti-noise capability.

I claim:

1. A three-state discernment circuit comprising:
   first signal generating means for generating a binary signal including logic 0 and 1 levels, said logic 0 and 1 levels being alternately generated in synchronism with a clock signal;
   means for applying said binary signal from said first signal generating means to one predetermined terminal through circuit means having a high output impedance, said predetermined terminal being adapted to be selectively connected to power source and ground potentials and opened therefrom;
   second signal generating means for receiving a first signal from said predetermined terminal to generate a second signal synchronous with said clock signal but delayed by one bit relative to said first signal;
   first logic means for receiving said first and second signals to produce a first logic output representative of an EXCLUSIVE OR combination thereof;
   second logic means for receiving said first logic output and one of said first and second signals to produce a second logic output representative of a NOR combination thereof; and
   third logic means for receiving said first logic output and an inversion of one of said first and second signals to produce a third logic output representative of a NOR combination thereof;
   whereby a desired signal is obtained from one of said first, second and third logic means in accordance with one of the condition that said predetermined terminal is connected to the power source potential, the condition that the predetermined terminal is connected to the ground potential and the condition that the predetermined terminal is opened from the power source and ground potentials.

2. A three-state discernment circuit comprising:
   first signal generating means for generating a binary signal including logic 0 and 1 levels, said logic 0 and 1 levels being alternately generated in synchronism with a clock signal;
   means for applying said binary signal from said first signal generating means to one predetermined terminal through circuit means having a high output impedance, said predetermined terminal being adapted to be selectively connected to power source and ground potentials and opened therefrom;
   second signal generating means for receiving a first signal from said predetermined terminal to generate a second signal synchronous with said clock signal but delayed by one bit relative to said first signal;
   first logic means for receiving said first and second signals to produce a first logic output representative of an EXCLUSIVE OR combination thereof;
   second logic means for receiving said first logic output and one of said first and second signals to produce a second logic output representative of a NOR combination thereof; and
   third logic means for receiving said first logic output and an inversion of one of said first and second signals to produce a third logic output representative of a NOR combination thereof;
   whereby, when said predetermined terminal is connected to the power source potential said first and second signals take a logic 1 level so that said first, second and third logic outputs take logic 0, 0 and 1 levels respectively, when said predetermined terminal is connected to the ground potential said first and second signals take a logic 0 level so that said first, second and third logic outputs take logic 0, 1 and 0 levels respectively, and when said predetermined terminal is opened from the power source and ground potentials said first and second signals take logic 0 and 1 levels alternately so that said first, second and third logic outputs take logic 1, 0 and 0 levels respectively.

* * * * *